United States Patent
Wang et al.

(10) Patent No.: US 10,304,965 B2
(45) Date of Patent: May 28, 2019

(54) DISPLAY PANEL

(71) Applicant: Innolux Corporation, Miao-Li County (TW)

(72) Inventors: Chao-Hsiang Wang, Miao-Li County (TW); Yi-Ching Chen, Miao-Li County (TW); Kuan-Feng Lee, Miao-Li County (TW); Hsin-Hung Lin, Miao-Li County (TW); Shou-Pu Yeh, Miao-Li County (TW); Yuan-Lin Wu, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 119 days.

(21) Appl. No.: 15/436,752

(22) Filed: Feb. 17, 2017

(65) Prior Publication Data
US 2017/0256653 A1 Sep. 7, 2017

(30) Foreign Application Priority Data

Mar. 2, 2016 (TW) .............................. 105106313 A

(51) Int. Cl.
*H01L 29/10* (2006.01)
*H01L 29/12* (2006.01)
(Continued)

(52) U.S. Cl.
CPC ...... *H01L 29/78696* (2013.01); *H01L 27/124* (2013.01); *H01L 27/1225* (2013.01);
(Continued)

(58) Field of Classification Search
CPC ......... G02F 1/136227; G02F 1/136286; G02F 1/1368; H01L 27/1225; H01L 27/124;
(Continued)

(56) References Cited

U.S. PATENT DOCUMENTS 4,968,119 A * 11/1990 Stewart ................. G02F 1/1368
 349/43
8,575,615 B2 11/2013 Saito et al.
2015/0048361 A1 * 2/2015 Yamakita ............ H01L 29/7869
 257/43

FOREIGN PATENT DOCUMENTS

CN 100463193 C 2/2009
JP 2009-055008 A 3/2009
(Continued)

OTHER PUBLICATIONS

Taiwanese Office Action dated Dec. 5, 2016.

*Primary Examiner* — Duy T Nguyen
(74) *Attorney, Agent, or Firm* — Rabin & Berdo, P.C.

(57) ABSTRACT

A display panel includes a first substrate, and the first substrate includes a base plate; a first conductive line disposed on the base plate and extending along the first direction; a second conductive line and a third conductive line disposed on the base plate and extending along the second direction; a contact pad positioned between the second and third conductive lines; a semi-conductive layer connecting the contact pad and the second conductive line, and the semi-conductive layer having a thickness d; and a pixel electrode connecting the contact pad. The semi-conductive layer has a channel width W (μm) and a channel length L (μm) between the contact pad and the second conductive line, and a pixel distance Px (μm) between the second and third conductive lines along the first direction, wherein the channel width W is conformed to the following equation:

$$(3.035 - 1.5) \leq W - 0.008 \times \left(\frac{P_x \times L}{\sqrt{d}}\right) \leq (3.035 + 1.5).$$

(Continued)

13 Claims, 10 Drawing Sheets

(51) Int. Cl.
    *H01L 29/786*     (2006.01)
    *H01L 27/12*     (2006.01)
    *G02F 1/1362*     (2006.01)
    *G02F 1/1368*     (2006.01)
    *H01L 27/32*     (2006.01)

(52) U.S. Cl.
    CPC ........ *H01L 29/786* (2013.01); *H01L 29/7869* (2013.01); *H01L 29/78618* (2013.01); *G02F 1/1368* (2013.01); *G02F 1/136227* (2013.01); *G02F 1/136286* (2013.01); *H01L 27/3248* (2013.01); *H01L 27/3262* (2013.01); *H01L 27/3276* (2013.01)

(58) Field of Classification Search
    CPC ............. H01L 27/3248; H01L 27/3262; H01L 27/3276; H01L 29/786; H01L 29/78618; H01L 29/7869; H01L 29/78696
    USPC .......................................................... 257/43
    See application file for complete search history.

(56) References Cited

FOREIGN PATENT DOCUMENTS

| | | | |
|---|---|---|---|
| JP | 2009055008 | * | 3/2009 |
| JP | 2009-122305 A | | 6/2009 |
| JP | 2014-082356 A | | 5/2014 |

* cited by examiner

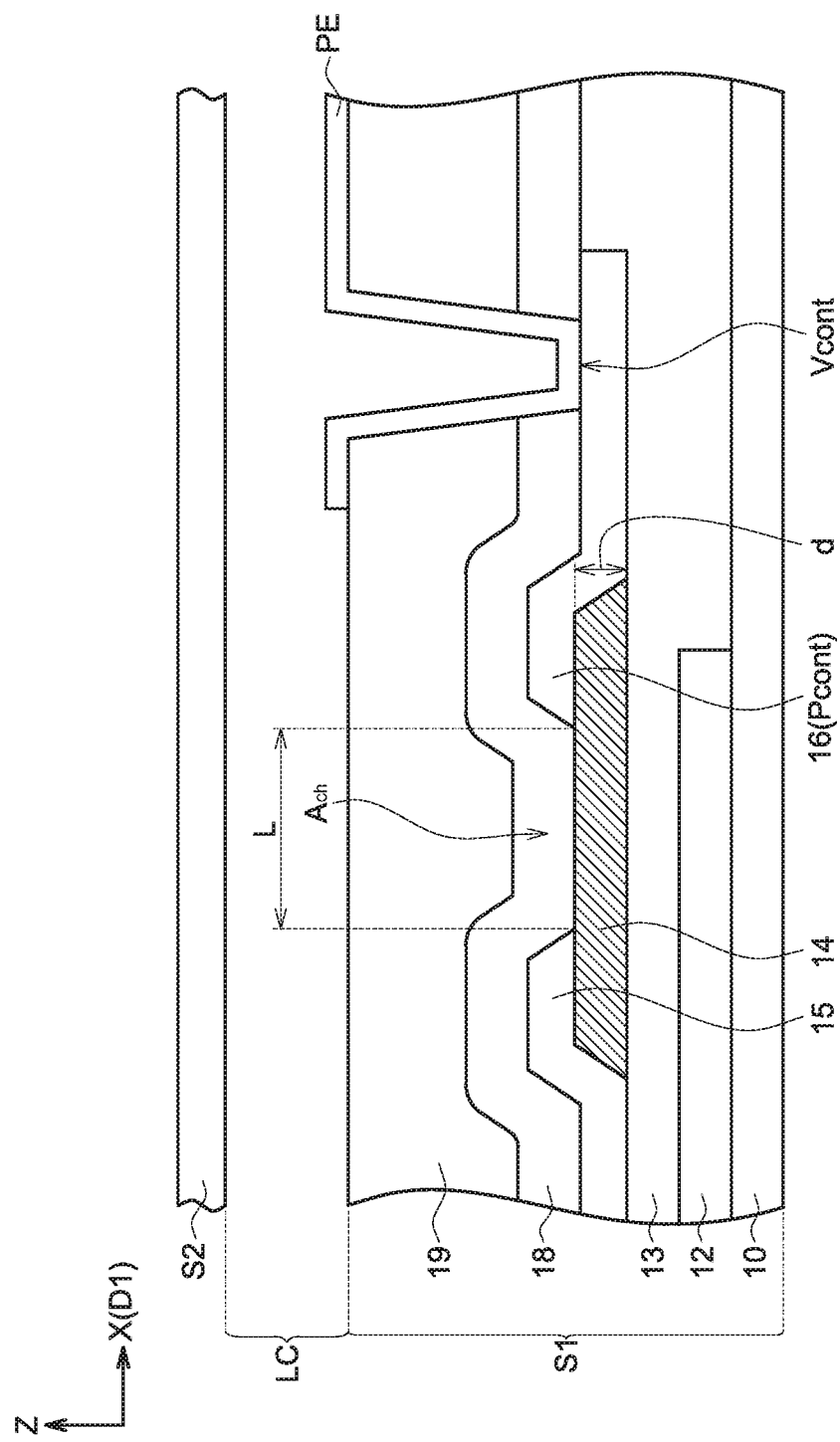

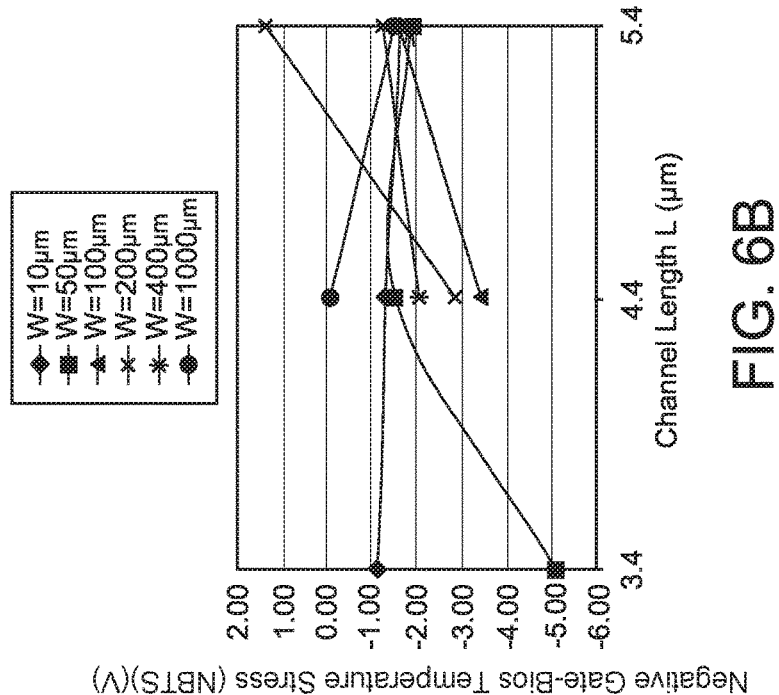
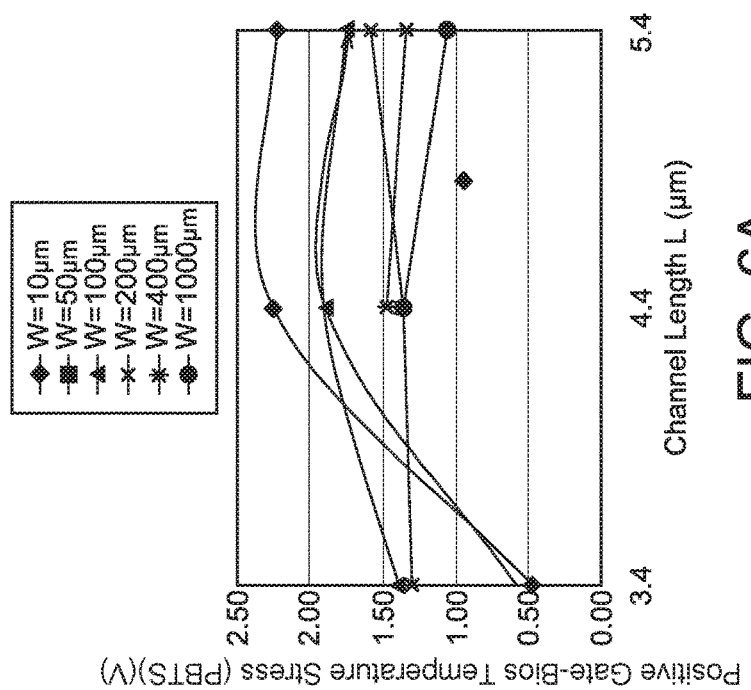

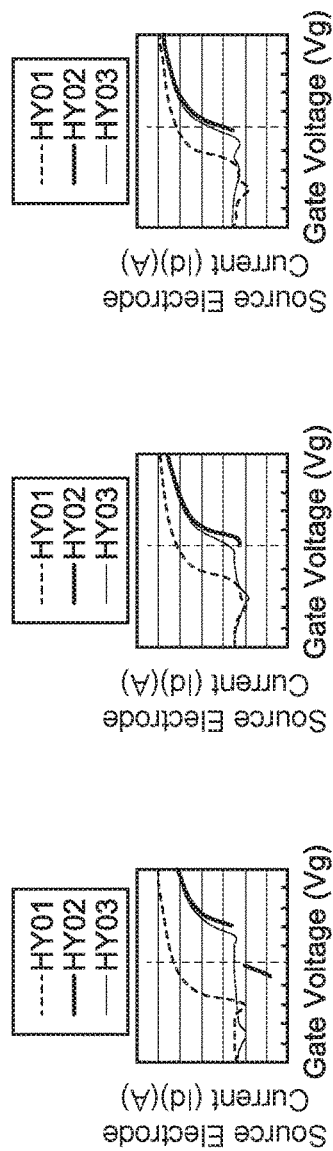
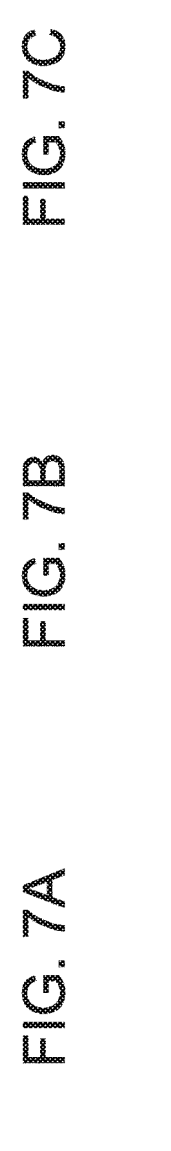
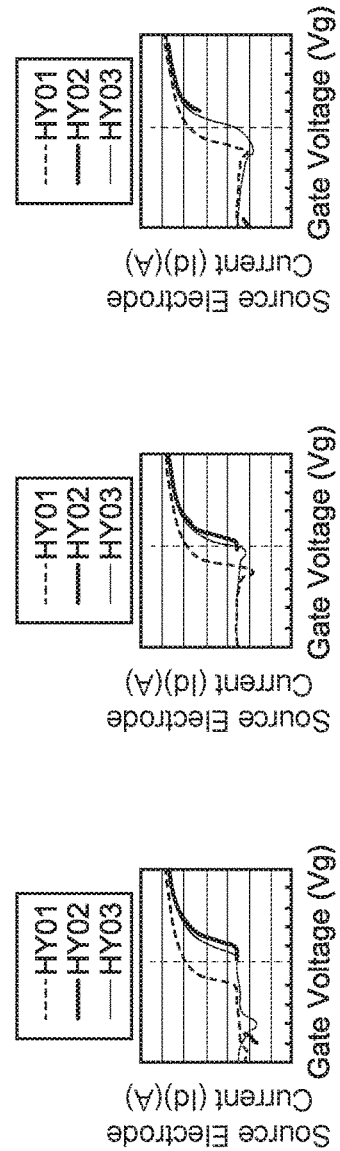
FIG. 7A   FIG. 7B   FIG. 7C
FIG. 7D   FIG. 7E   FIG. 7F

DISPLAY PANEL This application claims the benefit of Taiwan application Serial No. 105106313, filed Mar. 2, 2016, the subject matter of which is incorporated herein by reference.

BACKGROUND

Field of the Invention

The disclosure relates in general to a display panel, and more particularly to a transistor structure of a transistor array substrate of a display panel.

Description of the Related Art

Today, electronic products with display panels, such as smart phones, tablet personal computers (i.e. tablet PC, flat PC, ex: iPad), laptops, monitors, and televisions, are necessary tools for work and leisure in the daily life. Liquid crystal display (LCD) panel is the most popular display panel in use. For a LCD panel applicable to a flat display, an electronic visual display and an image display, the liquid crystal molecules aligned between two transparent electrodes rotate continuously depending on the polarity and magnitude of the electric field when the electric field is applied, and different gray scale expression can be adjusted and realized by varying the applied voltage. LCD panels provide a versatile choice in sizes, shapes and resolutions for the consumers.

With the development of down size and increase of resolution for the product in application, the size of semiconductor device of the display panel has been decreased for these years. However, the related factors such as the patterns and sizes of the metal layer and the semiconductor device have to be considered during fabrication, so that the electrical properties of the device of the display panel can be maintained with the decrease of the display panel size to meet the requirements of the commercial products in applications, such as high transmittance, high production yield, good reliability of electrical characteristics and stable displaying quality. The faulty design of the related components and layers of the display panel will lead to the decreases of the electrical performance, and have considerable effects on the displaying quality.

SUMMARY

The disclosure is related to a display panel, and a transistor structure design of a transistor array substrate of the embodiment maintains the electrical properties of the display panel with the decrease of the pixel size.

According to one embodiment of the disclosure, a display panel having a first substrate is provided. The first substrate includes a base plate; a first conductive line disposed on the base plate and extending along the first direction; a second conductive line and a third conductive line disposed on the base plate and extending along the second direction and spaced apart from each other, and the second conductive line and the third conductive line intersecting with the first conductive line; a contact pad positioned between the second conductive line and the third conductive lines; a semi-conductive layer connected to the contact pad and the second conductive line, and the semi-conductive layer having a thickness d; and a pixel electrode connected to the contact pad. The semi-conductive layer has a channel width W (μm) and a channel length L (μm) between the contact pad and the second conductive line, and a pixel distance Px (μm) is between the second and third conductive lines along the first direction, wherein the channel width W is conformed to the following equation:

$$(3.035 - 1.5) \le W - 0.008 \times \left(\frac{P_x \times L}{\sqrt{d}}\right) \le (3.035 + 1.5).$$

According to another embodiment of the disclosure, a transistor array substrate is provided, comprising several pixel regions arranged as an array, and one of the pixel regions comprise the aforementioned structure of the first substrate, and the channel width W fits the mathematical expression above.

The above and other aspects of the disclosure will become better understood with regard to the following detailed description of the preferred but non-limiting embodiments. The following description is made with reference to the accompanying drawings.

BRIEF DESCRIPTION OF THE DRAWINGS

FIG. 1 is a cross-sectional view of a BCE-type transistor array substrate of a display panel according to an embodiment of the disclosure.

FIG. 6A shows the curves of the positive gate-bios temperature stress (PBTS)(V) varied with the channel length L of the semi-conductive layer from 3.4 μm to 5.4 μm when the channel width W varies from 10 μm to 1000 μm, wherein the experiments are conducted at 70° C.

FIG. 6B shows the curves of the negative gate-bios temperature stress (NBTS)(V) varied with the channel length L of the semi-conductive layer from 3.4 μm to 5.4 μm when the channel width W varies from 10 μm to 1000 μm, wherein the experiments are conducted at 70° C.

FIG. 7A-FIG. 7F show the source electrode current (Id)-gate voltage (Vg) curves of the transistors obtained in the operation at 25° C. in the simulations, wherein the channel width W is a fixed value of 500 µm, and the channel length L is 3.8 µm, 4.8 µm, 5.8 µm, 6.8 µm, 7.8 µm and 8.8 µm, respectively.

DETAILED DESCRIPTION

Figure 2A:
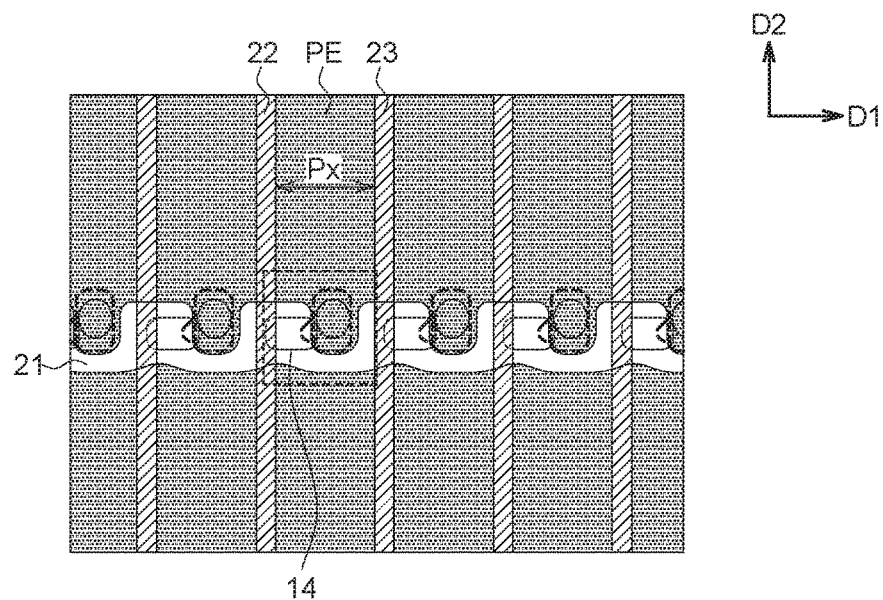
FIG. 2A is a top view of parts of the BCE-type transistor array substrate of an embodied display panel of the disclosure.

In the embodiment of the disclosure, a display panel having a transistor array substrate with a particular transistor structure design is provided. According to the embodied transistor structure design, the sizes of the feature parameters (such as the channel width and the channel length of the active layer) of the transistor can be reduced correspondingly with the decrease of the pixel size (ex: applied to a product with high resolution), and the electrical properties of the display panel are still well-maintained to satisfy the requirements of the commercial products in applications; for example, the charging capability and the load capacitance of the transistor have to meet the operating specifications of the product in application.

The embodiments are described in details with reference to the accompanying drawings. The embodiment of the disclosure can be applied to a liquid crystal display (LCD) panel having a back-channel-etch type thin film transistor (BCE-type TFT) array substrate. It is noted that the details of the structures of the embodiments are provided for exemplification, and the described details of the embodiments are not intended to limit the disclosure. It is noted that not all embodiments of the disclosure are shown. Modifications and variations can be made without departing from the spirit of the disclosure to meet the requirements of the practical applications. Thus, there may be other embodiments of the disclosure which are not specifically illustrated. Further, the accompany drawings are simplified for clear illustrations of the embodiment; sizes and proportions in the drawings are not directly proportional to actual products, and shall not be construed as limitations to the disclosure. Thus, the specification and the drawings are to be regard as an illustrative sense rather than a restrictive sense. Also, the identical and/or similar elements of the embodiments are designated with the same and/or similar reference numerals.

Moreover, use of ordinal terms such as "first", "second", "third", etc., in the specification and claims to modify an element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements. A liquid crystal display (LCD) panel having a BCE-type transistor array substrate is exemplified in the embodiment below for illustration.

Figure 2B:
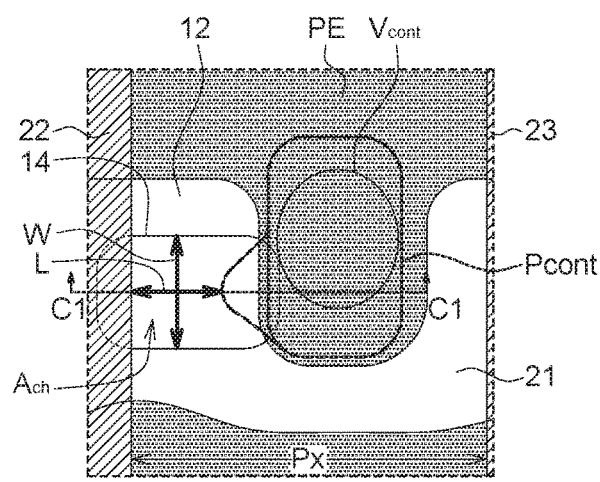
FIG. 2B depicts an enlarged portion of the dashed area of FIG. 2A.

FIG. 1 is a cross-sectional view of a BCE-type transistor array substrate of a display panel according to an embodiment of the disclosure. The display panel could be liquid crystal display (LCD), inorganic light emitting diode display (LED), organic light emitting diode display (OLED), or other types of display. FIG. 2A is a top view of parts of the BCE-type transistor array substrate of an embodied display panel of the disclosure. FIG. 2B depicts an enlarged portion of the dashed area of FIG. 2A. In one embodiment, as shown in FIG. 1, an embodied display panel includes a first substrate S1, a second substrate S2 opposite to the first substrate S1 and a display medium disposed between the first substrate S1 and the second substrate S2. In an embodiment, the first substrate S1 is a transistor array substrate, the second substrate S2 is a color filter substrate, and the display medium is a liquid crystal layer LC. In the other embodiment, the first substrate S1 is a transistor array substrate with light emitting diodes, the second substrate S2 is a covering substrate, and the display medium is light emitting diodes. Also, in the embodiment, the first substrate S1 having a source electrode 15 and a drain electrode 16 (i.e. the second metal layer) directly disposed on a semi-conductive layer (i.e. the active layer) and at two sides of a channel region $A_{ch}$ is exemplified for illustration.

As shown in FIG. 1, a transistor of a pixel region on a base plate 10 comprises a gate electrode 12 disposed on the base plate 10, a first insulating layer 13 disposed on the gate electrode 12, a semi-conductive layer 14 (functioning as an active layer) disposed on the first insulating layer 13 and having a channel region $A_{ch}$, a source electrode 15 and a drain electrode 16 (i.e. the second metal layer) disposed on the semi-conductive layer 14. The semi-conductive layer 14 can be made by the materials including silicon based semiconductor, such as amorphous silicon (a-Si) or low temperature poly silicon (LTPS), or metal oxide semiconductor, such as indium gallium zinc oxide (IGZO). Also, the transistor further comprises a second insulating layer 18 covering the source electrode 15 and the drain electrode 16, and a third insulating layer 19 disposed on the second insulating layer 18. In one embodiment, the first insulating layer 13, the second insulating layer 18, and third insulating layer 19 have a thickness ranged from 0.25 µm to 0.45 µm. The first insulating layer 13, the second insulating layer 18, and third insulating layer 19 may comprise materials including silicon oxide or silicon nitride. In the embodiment, a pixel region comprises a transistor. In other embodiment, a pixel region may comprise a plurality of transistors.

In each pixel region, the second insulating layer 18 has a via Vcont, wherein a pixel electrode PE of the pixel region is electrically connected to the second metal layer through the via Vcont; for example, the pixel electrode PE is electrically connected to the drain electrode 16 (i.e. the contact pad $P_{CONT}$) through the via Vcont, as shown in FIG. 1. In other embodiment, the pixel electrode PE could be connected to the source electrode 15. Please also refer to FIG. 2A and FIG. 2B, which show top views of the pixel regions. The cross-sectional view of FIG. 1 is taken along the cross-sectional line such as C1-C1 of FIG. 2B. In one pixel region, the first substrate S1 comprises a first conductive line 21 disposed on the base plate 10 and extending along the first direction D1, wherein the gate electrode 12 as shown in FIG. 1 is part of the first conductive line 21; a second conductive line 22 (ex: corresponding to the source electrode 15 of FIG. 1; i.e. a data line) and a third conductive line 23 (ex: another data line positioned adjacently and belong to neighboring pixel region) extending along the second direction D2 and spaced apart from each other, and the second conductive line 22 and the third conductive lines 23 intersect with the first conductive line 21; a contact pad $P_{CONT}$ (i.e. corresponding to the drain electrode 16 of FIG. 1) positioned between the second conductive line 22 and the third conductive line 23; and a semi-conductive layer 14 (such as an IGZO layer) is electrically connected to the contact pad $P_{CONT}$ and the second conductive line 22, and the semi-conductive layer has a thickness d (µm, please refer to FIG. 1). The pixel electrode PE is electrically connected to the contact pad $P_{CONT}$. According to the embodiment, the second conductive line 22, the third conductive line 23 and the contact pad $P_{CONT}$ are formed by patterning the same metal layer. The first conductive line 21, the second conductive line 22 and the third conductive line 23 are around the pixel region. Additionally, in one embodiment, the first direction D1 is perpendicular to the second direction D2. In other embodiment, the first direction D1 and the second direction D2 could have an included angle greater than 0 degree and less than 90 degrees. It is noted that the disclosure is not limited to the configuration details of FIG. 1; for example, the first direction D1 and the second direction D2 can form an angle in a range of 75 degrees to 90 degrees. Also, the second substrate S2 omits some other nonrelated elements for clearly revealing the features of the disclosure.

The disclosure studies and develops the relationship between the pixel size (pixel region size) and the transistor size (i.e. the channel size) to provide a correlated pixel structure design. As shown in FIG. 2B, the semi-conductive layer 14 has a first width (denoted by "W")(µm) along the second direction D2, and a first spacing (denoted by "L") (µm) between the contact pad $P_{CONT}$ and the second conductive line 22 along the first direction D1. The semi-conductive layer 14 has a channel region $A_{ch}$ (positioned substantially between the second conductive line 22 and the contact pad $P_{CONT}$), and the first spacing is identical to a channel length L. Typically, the first spacing is referred to the shortest distance between the second conductive line 22 and the contact pad $P_{CONT}$, and the first width is referred to the channel width W. The channel length L and the channel width W are commonly known to the skilled person in the field, which are not redundantly described herein. Also, there is a pixel distance Px (µm) between two adjacent edges of the second conductive line 22 and the third conductive line 23 along the first direction D1.

In the embodiment, several simulations of design for the configuration of the semi-conductive layer 14 as described above and depicted in FIG. 2A and FIG. 2B are conducted, to study the variations of device characteristics in accordance with variation of transistor size. Some simulations of design are provided below for illustration.

Figure 3:
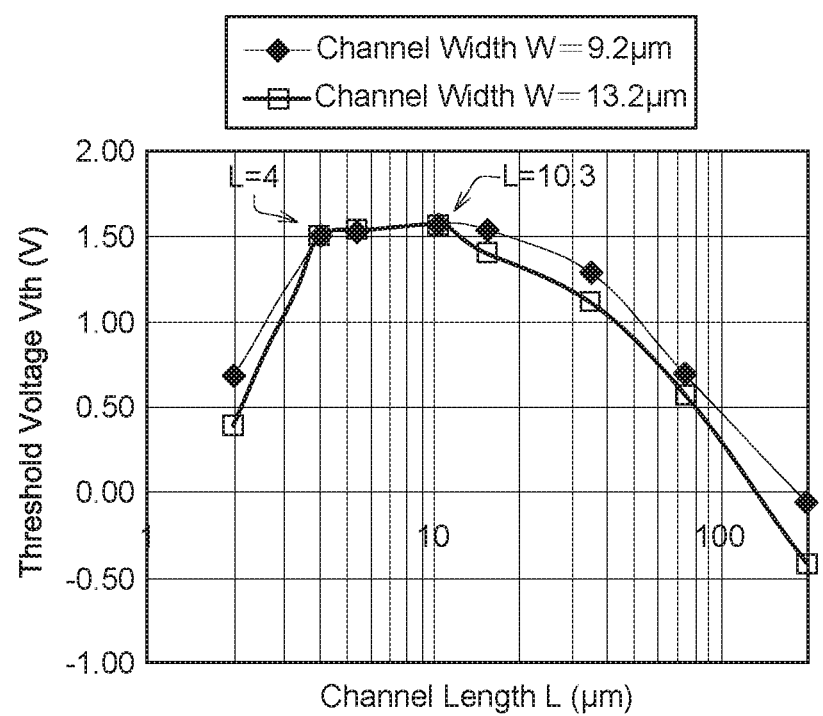
FIG. 3 shows the curves of the threshold voltage of the transistor varied with the channel length L of the semi-conductive layer when the channel width W value is fixed.

FIG. 3 shows the curves of the threshold voltage of the transistor varied with the channel length L of the semi-conductive layer when the channel width W value is fixed. In FIG. 3, two curves represent that the threshold voltage Vth of the transistor first increases to a high value and then levels off, and drops to a low value in accordance with the increases of the channel lengths L when the channel width W is 9.2 µm and 13.2 µm, respectively. The simulation creates a plot using a base 10 logarithmic scale for the channel lengths L labeled on X-axis of FIG. 3. According to the simulation results, when the channel lengths L is in a range of 4 µm to 10 µm, great consistence of the threshold voltage Vth can be achieved and the transistors have positive threshold voltages Vth (NMOS prefer). When the channel lengths L is less than 4 µm or greater than 10 µm, the transistors show poor consistence of the threshold voltage Vth and negative threshold voltages Vth.

Figure 4B:
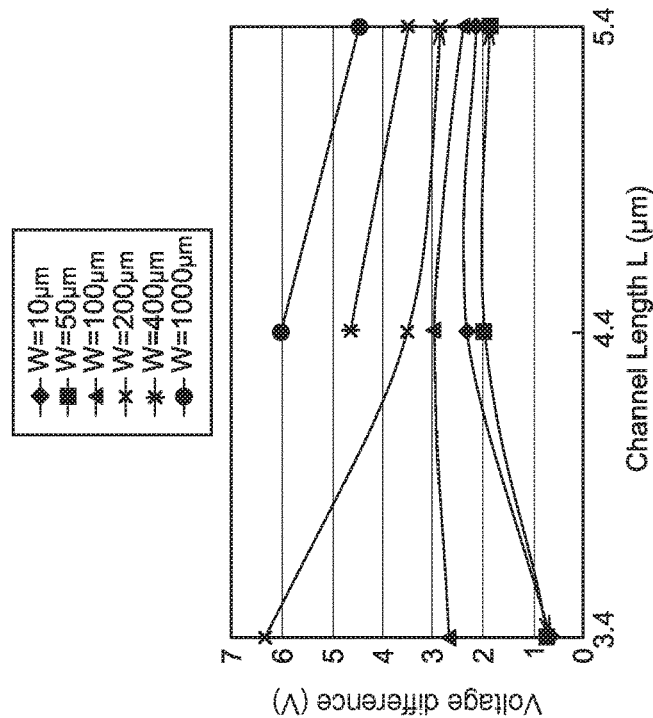
FIG. 4B presents the hysteresis curves of the transistor, which shows the voltage differences varied with the channel length L of the semi-conductive layer from 3.4 μm to 5.4 μm when the channel width W varies from 10 μm to 1000 μm, wherein the experiments are conducted at 25° C.
Figure 4A:
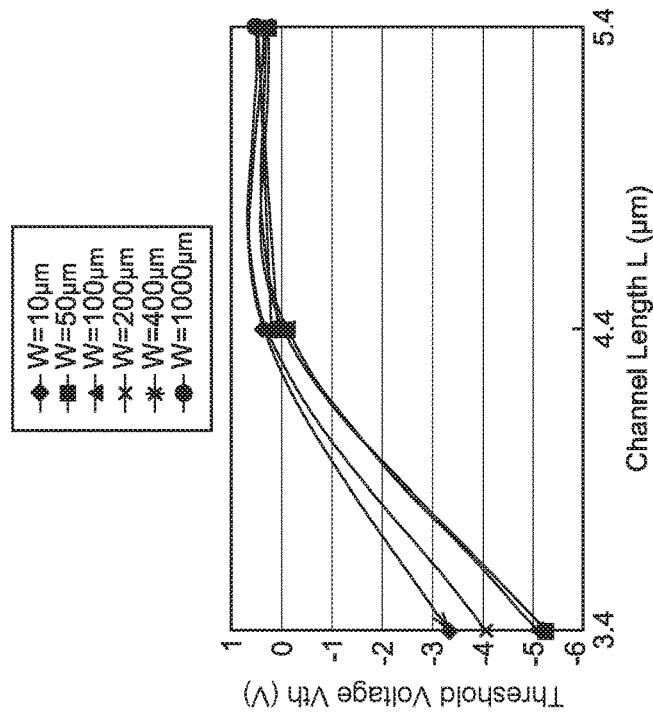
FIG. 4A shows the curves of the threshold voltage of the transistor varied with the channel length L of the semi-conductive layer from 3.4 μm to 5.4 μm when the channel width W varies from 10 μm to 1000 μm, wherein the experiments are conducted at 25° C.

FIG. 4A shows the curves of the threshold voltage of the transistor varied with the channel length L of the semi-conductive layer from 3.4 µm to 5.4 µm when the channel width W varies from 10 µm to 1000 µm, wherein the experiments are conducted at 25° C. FIG. 4B presents the hysteresis curves of the transistor, which shows the voltage differences varied with the channel length L of the semi-conductive layer from 3.4 µm to 5.4 µm when the channel width W varies from 10 µm to 1000 µm, wherein the experiments are conducted at 25° C. In the experiments, when the channel length L is 3.4 µm and the channel width W is 400 µm or 1000 µm, no values can be obtained since exposure of a channel region fails leading to direct connection between the source electrode and the drain electrode (S/D). When the channel length L is greater than 4.4 µm, good consistence and positive of the threshold voltage Vth can be achieved (FIG. 4A), and the hysteresis (i.e. the voltage differences, V) would not vary dramatically with the change of the channel width W (FIG. 4B). Results of FIG. 4B also indicate that the hysteresis increases with the increase of the channel width W when the channel length L is greater than 4.4 µm. For example, the hysteresis has a highest value when the channel width W is 1000 µm. The hysteresis at the channel width W of 1000 µm is greater than that at the channel width W of 10 µm or 50 µm.

Figure 5B:
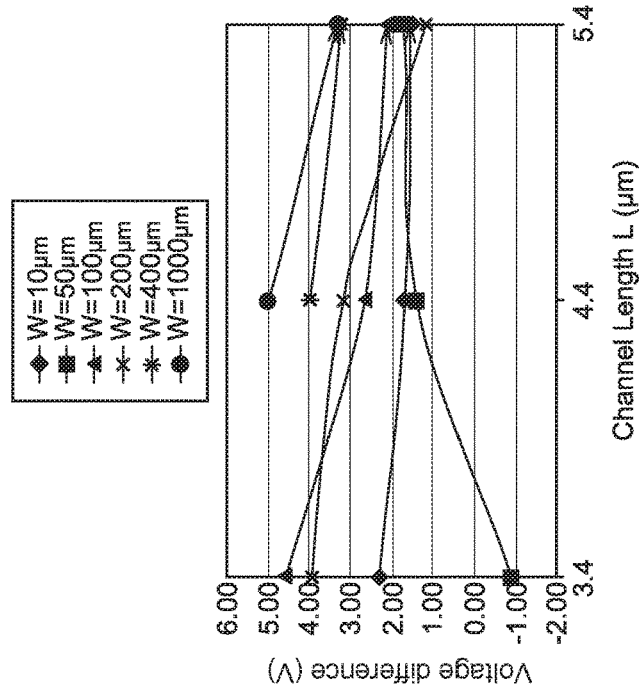
FIG. 5B presents the hysteresis curves of the transistor, which shows the voltage differences varied with the channel length L of the semi-conductive layer from 3.4 μm to 5.4 μm when the channel width W varies from 10 μm to 1000 μm, wherein the experiments are conducted at 70° C.
Figure 5A:
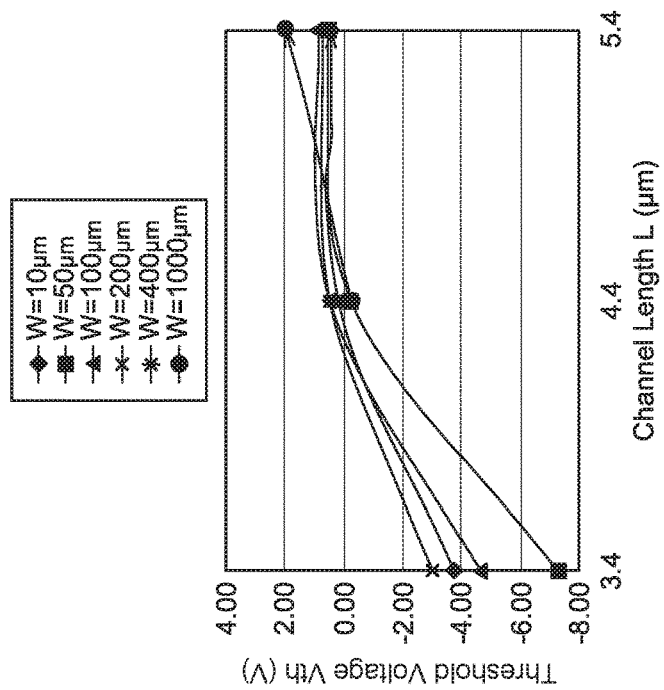
FIG. 5A shows the curves of the threshold voltage of the transistor varied with the channel length L of the semi-conductive layer from 3.4 μm to 5.4 μm when the channel width W varies from 10 μm to 1000 μm, wherein the experiments are conducted at 70° C.

FIG. 5A shows the curves of the threshold voltage of the transistor varied with the channel length L of the semi-conductive layer from 3.4 µm to 5.4 µm when the channel width W varies from 10 µm to 1000 µm, wherein the experiments are conducted at 70° C. FIG. 5B presents the hysteresis curves of the transistor, which shows the voltage differences varied with the channel length L of the semi-conductive layer from 3.4 µm to 5.4 µm when the channel width W varies from 10 µm to 1000 µm, wherein the experiments are conducted at 70° C. Similar to the results of FIG. 4A and FIG. 4B, when the channel length L is 3.4 µm and the channel width W is 400 µm or 1000 µm, no values can be obtained since exposure of a channel region fails leading to direct connection between the source electrode and the drain electrode (S/D). When the channel length L is greater than 4.4 µm, good consistence and positive of the threshold voltage Vth can be achieved (FIG. 5A), and the hysteresis (i.e. the voltage differences, V) would not vary dramatically with the change of the channel width W (FIG. 5B). Results of FIG. 5B also indicate that the hysteresis increases with the increase of the channel width W when the channel length L is larger than 4.4 µm. Compared to the experimental results of FIG. 4A, FIG. 4B and results of FIG. 5A, FIG. 5B, it has indicated that the variation tendencies of the threshold voltage and the hysteresis of the transistor are similar even when the experimental temperature is increased from 25° C. to 70° C.

FIG. 6A shows the curves of the positive gate-bios temperature stress (PBTS)(V) varied with the channel length L of the semi-conductive layer from 3.4 µm to 5.4 µm when the channel width W varies from 10 µm to 1000 µm, wherein the experiments are conducted at 70° C. FIG. 6B shows the curves of the negative gate-bios temperature stress (NBTS) (V) varied with the channel length L of the semi-conductive layer from 3.4 µm to 5.4 µm when the channel width W varies from 10 µm to 1000 µm, wherein the experiments are conducted at 70° C. When the channel length L is 3.4 µm and the channel width W is 400 µm or 1000 µm, no values can be obtained since exposure of a channel region fails leading to direct connection between the source electrode and the drain electrode (S/D). When the channel length L is greater than 4.4 µm, the PBTS value decreases with the increase of the channel width W (FIG. 6B)(however, it is required to consider the hysteresis effect). When the channel length L is greater than 4.4 μm, the NBTS values are smaller and more stable if the channel width W is less than 50 μm (NMOS (IGZO) prefer).

Figure 8B:
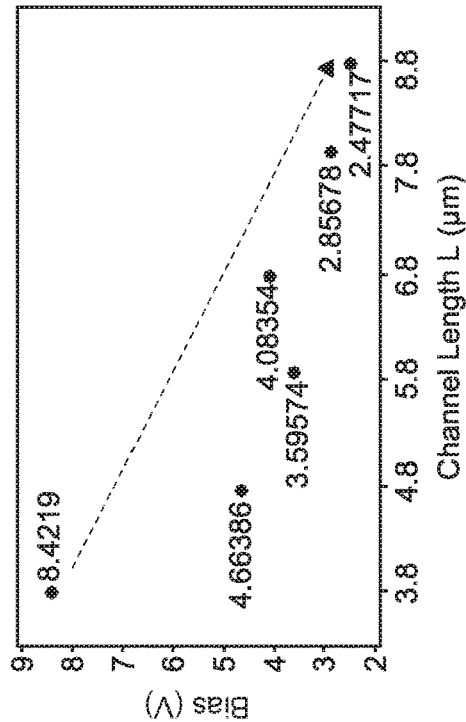
FIG. 8B is a graph plotted by the voltages (bias, also representing the hysteresis) obtained from FIG. 7A-FIG. 7F corresponding to the different channel lengths L.
Figure 8A:
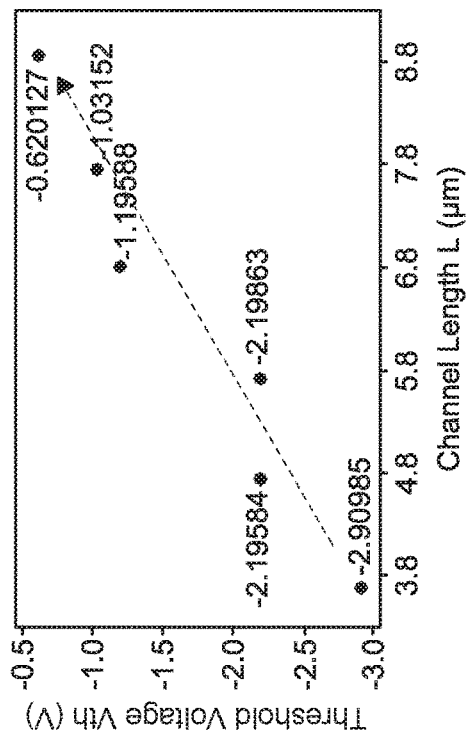
FIG. 8A is a graph plotted by the initial threshold voltages (Vth) obtained from FIG. 7A-FIG. 7F corresponding to the different channel lengths L.

FIG. 7A-FIG. 7F show the source electrode current (Id)-gate voltage (Vg) curves of the transistors obtained in the operation at 25° C. in the simulations, wherein the channel width W is a fixed value of 500 μm, and the channel length L is 3.8 μm, 4.8 μm, 5.8 μm, 6.8 μm, 7.8 μm and 8.8 μm, respectively. In each drawing of FIG. 7A-FIG. 7F, the I-V characteristic curve of the transistor, including curves HY01, HY02 and HY03, is plotted. The current-voltage measurements were conducted by varying the bias from negative voltage to the positive voltage for obtaining the curve HY01, followed by varying the bias from positive voltage to the negative voltage for obtaining the curve HY02, and finally varying the bias from negative voltage to the positive voltage for obtaining the curve HY03. Under a predetermined current value, the voltage difference between the curves HY01 and HY02 represents the extent of hysteresis. FIG. 8A is a graph plotted by the initial threshold voltages (Vth) obtained from FIG. 7A-FIG. 7F corresponding to the different channel lengths L. The plotted points in FIG. 8A are determined by obtaining the gate voltages (Vg) at the source electrode current (Id) of $1 \times 10^{-8}$ ampere in each of FIG. 7A-FIG. 7F. FIG. 8B is a graph plotted by the voltages (bias, also representing the hysteresis) obtained from FIG. 7A-FIG. 7F corresponding to the different channel lengths L. The plotted points in FIG. 8B are determined by obtaining the gate voltage difference between the curves HY01 and HY02 at the source electrode current (Id) of $1 \times 10^{-8}$ ampere in each of FIG. 7A-FIG. 7F.

According to the experimental results of FIG. 8A and FIG. 8B, when the channel width W is a fixed value of 500 μm, the initial threshold voltage (Vth) changes towards the positive value in accordance with the increase of the channel length L (FIG. 8A), and the bias decrease (i.e. the hysteresis decrease) in accordance with the increase of the channel length L (FIG. 8B). For example, the bias is 2.47717V when the channel length L is 8.8 μm. The smaller the hysteresis, the greater performance of the transistor.

According to the experimental results, there are preferable design ranges for the channel width W and the channel length L, respectively. Size reductions of the channel width W and the channel length L would be different from the decreasing extent of the pixel electrode PE (ex: the active layer (IGZO) of BCE-type TFT requires a certain size, and the size reduction would be difficult)). Relationship of the charging capability and the load capacitance of the transistor can be represented as below:

$$\frac{W/L}{R_{IGZO}} \propto C,$$

wherein $R_{IGZO}$ is resistance of the semi-conductive layer, 14 (ex: the IGZO layer), and $(W/L)/R_{IGZO}$ represents the charging capability of the transistor which is directly proportional to the load capacitance C.

The mathematical expression above can be represented as below by replacing $R_{IGZO}=\rho(L/(W*d_{IGZO}))$ and the load capacitance $C=mP_x^2$ (wherein m, n, a, b are constants):

$$\frac{W/L}{\rho(L/(W*d_{IGZO}))} \propto mP_x^2,$$

and then:

$$\frac{d_{IGZO}(W/L)^2}{\rho} \propto mP_x^2,$$

$$(W/L)^2 \propto \frac{(m \cdot \rho)P_x^2}{d_{IGZO}},$$

$$W/L \propto \frac{n \cdot P_x}{\sqrt{d_{IGZO}}},$$

$$W \propto \frac{L \cdot n \cdot P_x}{\sqrt{d_{IGZO}}},$$

and the channel width W can be represented as the equation (1):

$$W = a \times \frac{L \cdot P_x}{\sqrt{d_{IGZO}}} + b, \quad (1)$$

wherein b is a constant derived from the parasitic capacitance.

Thus, the equation (1) shows a simulated relationship between the channel width W and the channel length L, the pixel distance Px and the thickness d of the semi-conductive layer.

Figure 9A:
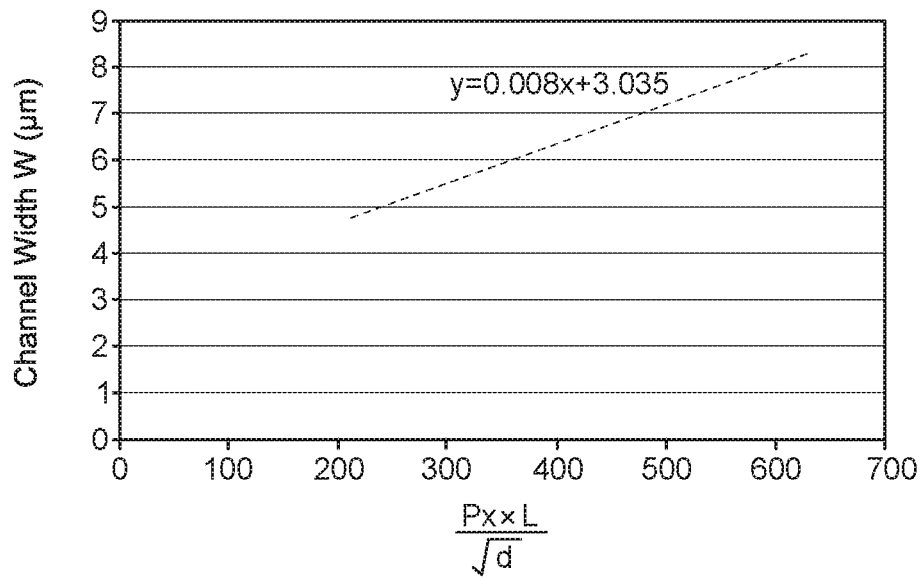
FIG. 9A and FIG. 9B depict the simulated design curves of the transistor design associated with the pixel configuration in the maintenance of the charging capability of the transistor according to the embodiment.
Figure 9B:
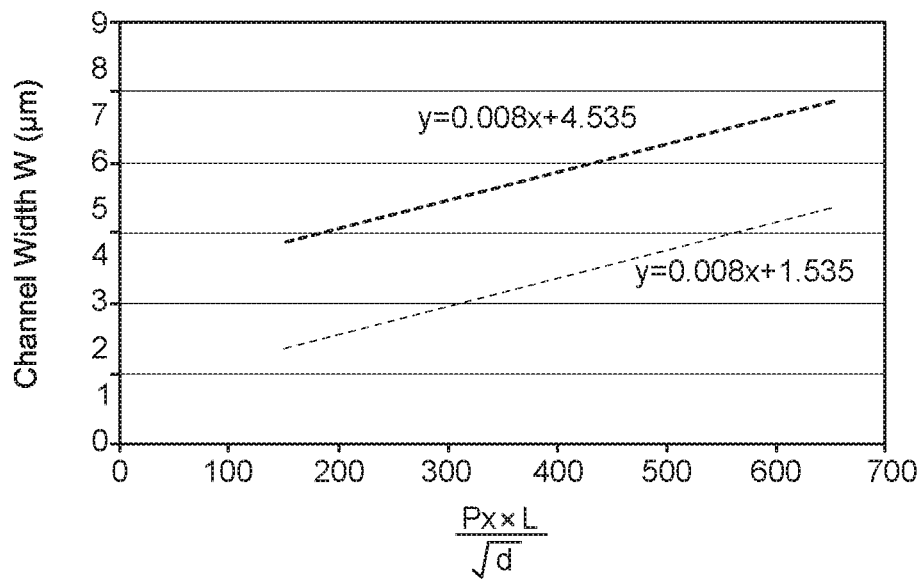

In the maintenance of the charging capability of the transistor, a simulated design curve of the transistor design associated with the pixel configuration, as shown in FIG. 9A or FIG. 9B, can be obtained by applying the equation (1) and the specifications of design parameters of general products (such as the voltage constant, the operation voltage range and pixel voltage, etc.). Afterwards, several product samples are fabricated according to the equation (1), the simulated design curve as shown in FIG. 9A or FIG. 9B and the specifications of design parameters of the commercial product. Then, those product samples are tested to investigate the electrical properties, and the test results show that they work normally in the operation and have good electrical properties.

Figure 10A:
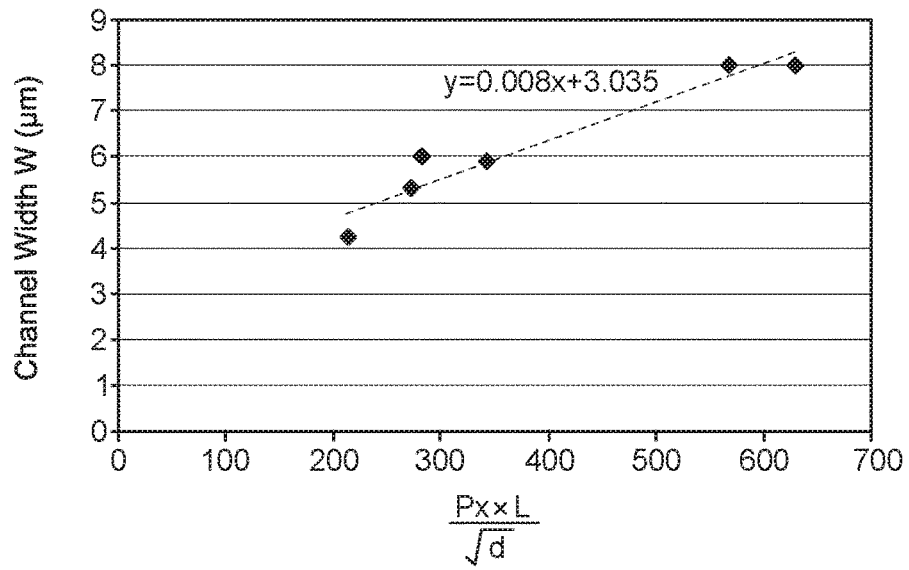
FIG. 10A and FIG. 10B show the related data points of the product samples (i.e. the experimental values), wherein the simulated design curve as shown in FIG. 9A and FIG. 9B are also incorporated (i.e. the dashed lines).
Figure 10B:
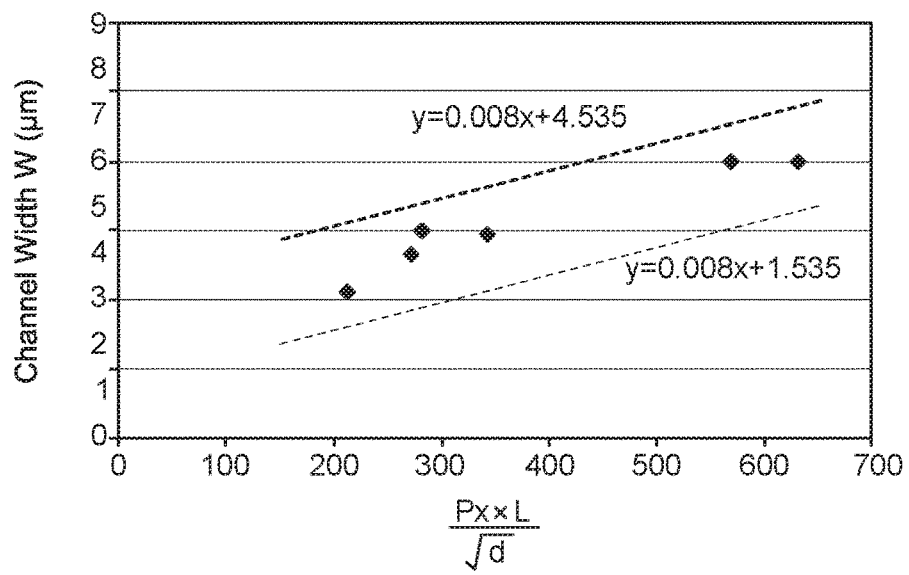

FIG. 10A and FIG. 10B show the related data points of the product samples (i.e. the experimental values of the data points coming from the product samples actually made), wherein the simulated design curve as shown in FIG. 9A and FIG. 9B are also incorporated in FIG. 10A and FIG. 10B (i.e. the dashed lines in FIG. 10A and FIG. 10B). FIG. 10A $$\left(\text{i.e. a plot of the channel width versus } \frac{P_x \times L}{\sqrt{d}}\right)$$

has indicated that those related data points of the product samples do fit the trend of the simulated design curve (the dashed line). Also, FIG. 10B has indicated that those related data points of the product samples fall between two simulated design curves having b=4.535 and b=1.535, wherein a=0.008. Considering the factors of the process variation and different element materials in use, the channel width W of an embodiment can be represented as the following equation:

$$W = 0.008 \times \left(\frac{P_X \times L}{\sqrt{d}}\right) + (3.035 \pm 1.5),$$

and further expressed as the equation (2):

$$(3.035 - 1.5) \leq W - 0.008 \times \left(\frac{P_x \times L}{\sqrt{d}}\right) \leq (3.035 + 1.5), \quad (2)$$

wherein d is the thickness of the semi-conductive layer (ex: the semi-conductive layer 14 in FIG. 1), L is the channel length, and Px is the pixel distance. Also, units of the width, length, thickness and distance in the equation (2) are micrometer (μm).

Thus, the channel width W of the embodiment can be designed in accordance with the equation (2), and the products fabricated according to the embodiment design do meet the requirements of the electrical properties of the commercial products after production tests.

Moreover, in one embodiment, the channel width W is ranged from 4 μm to 10 μm, and preferably 4 μm to 6 μm. In one embodiment, the channel length L is ranged from 3 μm to 8 μm, and preferably 3 μm to 5 μm. In one embodiment, a ratio of the channel width W to the channel length L (W/L) is in a range of 0.5 to 2. It is known to the people skilled in the art that the feature sizes, such as the sizes of the channel width W, the channel length L and etc., can be varied and selected according to the requirement of the product in application, and those numerical values provided herein are disclosed merely for illustration, not for restriction.

According to the aforementioned descriptions, the transistor array substrate with a particular transistor structure design of the embodiment, such as the transistor of an BCE-type TFT array substrate, the channel width W of the semi-conductive layer (such as an IGZO layer) along the second direction D2 (i.e. vertical to the direction of the channel length) can be designed in accordance with the equation (2) provided in the embodiment. Also, production tests have further performed on the products fabricated according to the embodiment design, and the test results have proven that the fabricated products do meet the requirements of the electrical properties of the commercial products. Therefore, according to the embodied pixel structure design, the sizes of the related feature elements (such as the channel width and the channel length of the semi-conductive layer (ex: an IGZO layer)) can be reduced correspondingly with the decrease of the pixel size (ex: applied to a product with high resolution), and the electrical properties of the product are still well-maintained to meet the operating specifications of the product in application; for example, the charging capability and the load capacitance of the transistor still satisfy the requirements of the commercial products in applications.

While the invention has been described by way of example and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:
1. A display panel, comprising:
a first substrate, comprising:
a base plate;
a first conductive line, disposed on the base plate and extending along a first direction;
a second conductive line and a third conductive line disposed on the base plate, the second conductive line and the third conductive line extending along a second direction and spaced apart, and the second conductive line and the third conductive line intersecting with the first conductive line, wherein the first conductive line and the second conductive line form a first overlapping region;
a contact pad, disposed between and spaced apart from the second conductive line and the third conductive line;
a semi-conductive layer, disposed on the base plate and connected to the contact pad and the second conductive line, part of the semi-conductive layer overlaps with part of the second conductive line and part of the contact pad in a normal direction of the base plate, wherein the semi-conductive layer and the second conductive line form a second overlapping region, and a maximum width of the first overlapping region along the second direction is greater than a maximum width of the second overlapping region along the second direction; and
a pixel electrode, connecting the contact pad;
wherein the semi-conductive layer having a thickness d, the semi-conductive layer has a channel width W (μm) and a channel length L (μm) between the contact pad and the second conductive line, and a pixel distance Px (μm) is between the second conductive line and the third conductive line along the first direction, wherein the channel width W is conformed to the following equation:

$$(3.035 - 1.5) \leq W - 0.008 \times \left(\frac{P_x \times L}{\sqrt{d}}\right) \leq (3.035 + 1.5).$$

2. The display panel according to claim 1, wherein the semi-conductive layer comprises metal oxide semiconductor.

3. The display panel according to claim 1, wherein the channel width W is ranged from 4 μm to 10 μm, and the channel length L is ranged from 3 μm to 8 μm.

4. The display panel according to claim 3, wherein the channel width W is ranged from 4 μm to 6 μm, and the channel length L is ranged from 3 μm to 5 μm.

5. The display panel according to claim 1, wherein a ratio of the channel width W to the channel length L is ranged from 0.5 to 2.

6. The display panel according to claim 1, wherein the channel length L is parallel to the first direction.

7. The display panel according to claim 1, wherein the first direction is perpendicular to the second direction.

8. The display panel according to claim 1, wherein the first conductive line, the second conductive line and the third conductive line are around a pixel region of the first substrate.

9. The display panel according to claim 1, further comprising a first insulating layer disposed between the first conductive line and the semi-conductive layer, and a second insulating layer disposed between the contact pad and the pixel electrode, wherein the second insulating layer has a via, and the pixel electrode is electrically connected to the contact pad through the via.

10. The display panel according to claim 9, wherein the first insulating layer has a thickness ranged from 0.25 μm to 0.45 μm.

11. The display panel according to claim 1, wherein the first overlapping region overlaps with the second overlapping region in a normal direction of the base plate.

12. A display panel, comprising:
- a first substrate, comprising:
  - a base plate;
  - a first conductive line, disposed on the base plate and extending along a first direction;
  - a second conductive line and a third conductive line disposed on the base plate, the second conductive line and the third conductive line extending along a second direction and spaced apart, and the second conductive line and the third conductive line intersecting with the first conductive line;
  - a contact pad, disposed between and spaced apart from the second conductive line and the third conductive line;
  - a semi-conductive layer, disposed on the base plate and connected to the contact pad and the second conductive line, part of the semi-conductive layer overlaps with part of the second conductive line and part of the contact pad in a normal direction of the base plate; and
  - a pixel electrode, connecting the contact pad;
- wherein the first conductive line and the second conductive line form a first overlapping region, the semiconductor layer and the second conductive line form a second overlapping region, and a maximum width of the first overlapping region along the second direction is greater than a maximum width of the second overlapping region along the second direction.

13. The display panel according to claim 12, wherein the first overlapping region overlaps with the second overlapping region in the normal direction of the base plate.

\* \* \* \* \*